(12) United States Patent
Togawa

(10) Patent No.: US 9,634,623 B2
(45) Date of Patent: Apr. 25, 2017

(54) CLASS-D POWER AMPLIFIER

(71) Applicant: Yamaha Corporation, Hamamatsu-shi, Shizuoka-ken (JP)

(72) Inventor: Takeshi Togawa, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 14/311,030

(22) Filed: Jun. 20, 2014

(65) Prior Publication Data

US 2014/0301577 A1  Oct. 9, 2014

Related U.S. Application Data

(63) Continuation of application No. PCT/JP2012/082872, filed on Dec. 19, 2012.

(30) Foreign Application Priority Data

Dec. 20, 2011  (JP) ................. 2011-278154

(51) Int. Cl.
*H03F 3/217* (2006.01)
*H03F 3/183* (2006.01)
(Continued)

(52) U.S. Cl.
CPC ............ *H03F 3/217* (2013.01); *H03F 1/523* (2013.01); *H03F 3/181* (2013.01); *H03F 3/183* (2013.01); *H03F 3/68* (2013.01)

(58) Field of Classification Search
None
See application file for complete search history.

(56) References Cited

U.S. PATENT DOCUMENTS

| 6,373,336 B1 | 4/2002 | Anderskouv et al. |
| 2007/0139839 A1* | 6/2007 | Yoshihara ................. H03F 1/52 361/93.1 |

FOREIGN PATENT DOCUMENTS

| CN | 1311918 A | 9/2001 |
| JP | 09-214265 A | 8/1997 |

(Continued)

OTHER PUBLICATIONS

Chinese Search Report dated Dec. 30, 2015, for CN Application No. 201280062989.8, with English translation, four pages.

(Continued)

*Primary Examiner* — Curtis Kuntz
*Assistant Examiner* — Kenny Truong
(74) *Attorney, Agent, or Firm* — Morrison & Foerster LLP

(57) ABSTRACT

The invention is provided with a first class-D amplifying unit for amplifying an inputted audio signal and supplying the amplified signal to a positive side of an audio output terminal, a second class-D amplifying unit for amplifying an inputted audio signal inverted in an inverting unit and supplying the amplified signal to a negative side of the audio output terminal, wherein, in a first mode, the first and second class-D amplifying units are activated and outputs of the first and second class-D amplifying units are kept equal to or less than a first current value, and wherein, in a second mode, the first class-D amplifying unit is activated, the second class-D amplifying unit is inactivated, the negative side of the audio output terminal is grounded, and output of the first class-D amplifying unit is kept equal to or less than a second current value larger than the first current value.

4 Claims, 3 Drawing Sheets

(51) Int. Cl.
  *H03F 3/181*    (2006.01)
  *H03F 1/52*     (2006.01)
  *H03F 3/68*     (2006.01)

(56) References Cited

FOREIGN PATENT DOCUMENTS

| | | | |
|---|---|---|---|
| JP | 09214265 A | * | 8/1997 |
| JP | 2002-521949 A | | 7/2002 |
| JP | 2002-246852 A | | 8/2002 |
| JP | 2002246852 A | * | 8/2002 |
| JP | 2007-258903 A | | 4/2007 |
| JP | 2009-200551 A | | 9/2009 |
| JP | 2010-41474 A | | 2/2010 |
| WO | WO-2013/094626 A1 | | 6/2013 |

OTHER PUBLICATIONS

Notification of the First Office Action dated Dec. 30, 2015, for CN Application No. 201280062989.8, with English translation, 16 pages.
Written Opinion of the International Searching Authority of the PCT Application No. PCT/JP2012/082872, mailed Mar. 12, 2013, English translation, four pages.
Anonymous. (Nov. 29, 2011). "Constant-voltage speaker system," retrieved from Wikipedia.org, edited by Binksternet, located at: URL:http://en.wikipedia.org/w/index.php?title=Constant_voltage_speaker_system&oldid=463042107, five pages.
International Search Report dated Mar. 12, 2013, for PCT Application No. PCT/JP2012/082872, two pages.

* cited by examiner

BLOCK DIAGRAM ILLUSTRATING STRUCTURE OF AMPLIFIER

Fig. 2

EXAMPLE OF CONSTANT VOLTAGE SPEAKER SYSTEM

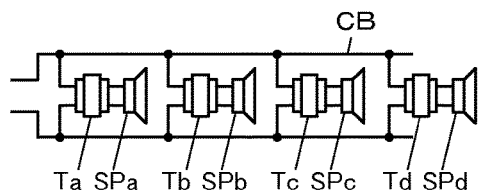

Fig. 3

OPERATING MODES PREPARED IN AMPLIFIER

| OPERATING MODE | PWM MODULATOR | | | | SWITCH | | CURRENT UPPER LIMIT VALUE | | | |
|---|---|---|---|---|---|---|---|---|---|---|
| | X1 | X2 | X3 | X4 | S1 | S2 | I1 | I2 | I3 | I4 |
| FIRST (H Z) | OP | OP | OP | OP | OFF | OFF | FIRST VALUE | FIRST VALUE | FIRST VALUE | FIRST VALUE |
| SECOND (4 Ω) | OP | ST | ST | OP | ON | ON | SECOND VALUE | NOT NECESSARY | NOT NECESSARY | SECOND VALUE |
| THIRD (8 Ω) | OP | OP | ST | ST | OFF | OFF (ON is also accepable) | THIRD VALUE | THIRD VALUE | NOT NECESSARY | NOT NECESSARY |

OP: OPERATED, ST: STOPPED

Fig. 4

PRIOR ART

CONVENTIONAL CLASS-D AMPLIFIER (HALF BRIDGE)

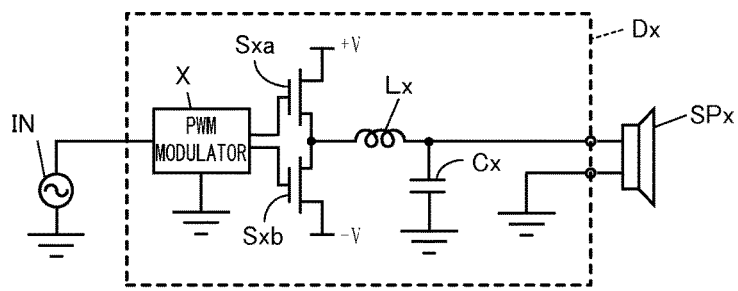

CONVENTIONAL CLASS-D AMPLIFIER (FULL BRIDGE)

POWER SUPPLY VOLTAGE UTILIZATION RATIO AND
POWER EFFICIENCY IN CLASS-D AMPLIFIER

CLASS-D POWER AMPLIFIER

CROSS-REFERENCE TO RELATED APPLICATIONS

This application is a continuation of International Application No. PCT/JP2012/082872, filed Dec. 19, 2012, which claims the priority benefit of Japanese Patent Application No. 2011-278154 filed Dec. 20, 2011, the contents of which are hereby incorporated by reference in their entireties for all intended purposes.

TECHNICAL FIELD

This invention relates to a class-D power amplifier to which either a speaker system called a constant voltage system or a low impedance speaker of 4Ω, 8Ω, or the like are connectable.

BACKGROUND ART

It has been conventionally known a class-D power amplifier which performs power amplification by a class-D operating method which converts an inputted analog signal into a pulse-width modulation (PWM) signal and on-off controls a switching element of an output stage by the pulse-width modulation signal.

FIG. 4 and FIG. 5 illustrate structures of class-D amplifiers as examples of the conventional class-D power amplifier. Illustrated in FIG. 4 is an example of a half-bridge connection, and illustrated in FIG. 5 is an example of a full-bridge connection.

First, in the case of the half-bridge connection, as illustrated in FIG. 4, one speaker SPx is connected to one class-D power amplifying unit Dx.

Then, in the class-D power amplifying unit Dx, an analog audio signal to be amplified is inputted as an input signal IN, voltage thereof is PWM-modulated by the PWM modulator X, and is converted to a PWM signal. Then, this PWM signal is supplied to each of a switching element Sxa provided between a positive side power supply (+V) and an output signal line and a switching element Sxb provided between a negative side power supply (−V) and the output signal line, so as to complementarily drive the switching elements Sxa and Sxb. That is, the switching elements Sxa and Sxb are driven so that, for example, when the PWM signal is at a high level, the switching element Sxa turns on and meanwhile the switching element Sxb turns off, and conversely when the PWM signal is at a low level, the switching element Sxa turns off and meanwhile the switching element Sxb turns on.

In this manner, electric current flows from the positive side power supply to the output signal line at a timing the switching element Sxa conducts, and electric current flows from the output signal line to the negative side power supply at a timing the switching element Sxb conducts. By passing this current varying according to high/low of the PWM signal through a low-pass filter formed by a coil Lx and a capacitor Cx, a carrier signal used for the PWM conversion can be removed, thereby demodulating it to an analog audio signal which is a power-amplified input signal IN (the maximum voltage which can be outputted depends on the voltage of the power supply). Therefore, by supplying the signal passed through the low-pass filter to the speaker SPx via an audio output terminal, a speaker SPx can be driven with the analog audio signal which is the amplified input signal IN. Note that the signal returning from the speaker to the class-D power amplifying unit Dx flows to the ground of the amplifier.

Further, in the case of the full-bridge connection, as illustrated in FIG. 5, one speaker SPx is connected to the two class-D power amplifying units Dx, Dy.

Then, in the class-D power amplifying unit Dx, similarly to the case of FIG. 4, an analog audio signal which is a power-amplified input signal IN is supplied to the speaker SPx.

On the other hand, to the class-D power amplifying unit Dy, the input signal IN is inverted between positive and negative by an inverter E and inputted. Then, this inverted signal is PWM-modulated in a PWM modulator Y similarly to the case of the class-D power amplifying unit Dx, and drives the switching elements Sya and Syb complementarily with a PWM signal as a modulation result thereof. Thus, by passing through the low-pass filter formed by a coil Ly and a capacitor Cy, an analog audio signal which is exactly the same as that on the class-D power amplifying unit Dx side except that it is inverted between positive and negative can be supplied to the speaker SPx. Note that the power supply is common between the class-D power amplifying unit Dx and the class-D power amplifying unit Dy.

Here, by connecting two terminals of the speaker SPx to the class-D power amplifying units Dx and Dy, respectively, the speaker SPx can be driven with a signal of difference of the analog audio signals supplied from the class-D power amplifying units Dx and Dy, respectively. The analog audio signals supplied respectively from the class-D power amplifying units Dx and Dy are signals inverted between positive and negative as described above, and thus by taking the difference, the speaker SPx can be driven by voltage that is two times the case of the half-bridge connection.

Such a class-D power amplifier is known as an amplifier with quite high efficiency. Further, as technology related to such a class-D power amplifier, for example, ones described in PTL1 and PTL2 are known.

Further, as the speaker connected to the class-D power amplifier, for example, a low-impedance single speaker whose impedance is 4Ω or 8Ω is widely used. However, besides this, it is also practiced to connect plural speakers in parallel by a system called constant voltage system.

Such a constant voltage system transmits an audio signal with high voltage and low current from the amplifier to respective speakers, converts them to a low voltage signal by a step-down transformer provided in an input unit of each speaker, and drives the speaker with this low voltage signal. That is, a high-impedance signal line is used as a main signal line connecting the amplifier and the respective speakers, and the plural speakers are connected in parallel thereto, respectively, via the step-down transformers.

Such a constant voltage system is described in, for example, NPL1.

CITATION LIST

Patent Literature

{PTL1} JP 2010-41474 A
{PTL2} JP 2009-200551 A

Non Patent Literature

{NPL1} Constant voltage speaker system, [Online], Nov. 29, 2011, Wikipedia.org, [retrieved on Dec. 18, 2011], the Internet <URL:http://en.wikipedia.org/w/index.php?title=Constant_voltage_speaker_system&oldid=463042107>

SUMMARY OF INVENTION

Technical Problem

Meanwhile, it is conceivable that the class-D power amplifier as described above is structured to be capable of connection with either a speaker of low impedance or speakers of constant voltage system through the same audio output terminal.

First, when considering to make it to be compatible with the constant voltage system, although depending on the standards employed, in the case of a 100 V system for example, output of 100 Vrms at most (effective voltage is 100 volts) is necessary. Then, when the above-described half-bridge structure is employed, to obtain this output, power supply voltage of ±150 V or more is necessary as the positive side power supply and the negative side power supply.

In this case, as the switching elements Sxa and Sxb, withstand voltage of 300 V or more is required, which is a voltage difference between the positive side power supply and the negative side power supply. However, currently, among MOSFETs (Metal-Oxide-Semiconductor Field-Effect Transistors) widely used as the switching elements Sxa and Sxb, those having withstand voltage of 250 V or more tends to be significantly inferior in aspects of cost and performance, as compared to those having withstand voltage of 250 V or less. Therefore, with the structure of half bridge, it can be said that it is difficult to produce a class-D power amplifier to which the speakers of the constant voltage system can be connected.

On the other hand, when the structure of full bridge is operated, the power supply voltage may be half that in the case of half bridge. Therefore, the withstand voltage required for MOSFETs is also low, allowing to produce a class-D power amplifier with sufficient performance at low costs.

However, a problem occurs in this structure as it is when this class-D power amplifier is not made dedicated to driving of the constant voltage system but made usable also for driving of the low impedance speaker.

The power amplifier is designed by choosing a power supply and elements (transistors, coils, capacitors, and so on) of an output stage corresponding to the sound system and/or maximum output power to which it is targeted. In this case, first, in order to drive the 100 V constant voltage system by the full-bridge structure, a power supply of voltage of about ±80 V and of a current capacity that matches a desired maximum output power is employed, and further, as the switching element in the output stage, for example, a high-speed MOSFET having withstand voltage of 80 V or more is employed.

When driving the low-impedance speaker (for example, 4Ω), large current flows to the speaker with low voltage, and thus in this structure (that is, the same power supply, the same output stage elements, and the same full-bridge structure), only a small part of about ±80 V (however, it decreases according to increase in current) of the power supply is used by the speaker, and the rest of the voltage is applied to the elements of the output stage, thereby decreasing a power supply voltage utilization ratio.

In general, between the power supply voltage utilization ratio and power efficiency (=power supplied to a speaker/power supplied by a power supply) of the class-D amplifier, there is a relation as illustrated in FIG. 6. As can be seen from FIG. 6, a low power supply voltage utilization ratio rapidly worsens the power efficiency.

This invention has been made based on such a background, and it is an object thereof to enable to produce at low cost a class-D power amplifier which is capable of efficiently driving both a speaker of low impedance and a speaker of constant voltage system while utilizing a common audio output terminal to connect with the both speakers.

Solution to Problem

To attain the above object, a class-D power amplifier of the invention includes: an audio output terminal; a mode specifying unit which specifies one of a first mode and a second mode; a first class-D amplifying unit which converts an inputted audio signal into a pulse-width modulated signal and power-amplifies this signal, and supplies the power-amplified audio signal to a positive side of the audio output terminal; an inverting unit which inverts a polarity of the inputted audio signal; a second class-D amplifying unit which converts the audio signal inverted in the inverting unit into a pulse-width modulated signal and power-amplifies this signal, and supplies the power-amplified audio signal to a negative side of the audio output terminal; a first mode control unit which activates the first and second class-D amplifying units when the first mode is specified, and performs protection so that outputs of the first and second class-D amplifying units each become equal to or less than a first current value; and a second mode control unit which inactivates one of the first class-D amplifying unit and the second class-D amplifying unit and activates the other when the second mode is specified, grounds a side corresponding to the inactivated class-D amplifying unit out of the positive side and the negative side of the audio output terminal, and performs protection so that an output of the activated class-D amplifying unit becomes equal to or less than a second current value larger than the first current value.

Another class-D power amplifier of the invention includes: a first audio output terminal; a second audio output terminal; a mode specifying unit which specifies one of a first mode and a second mode; a first class-D amplifying unit which converts an inputted first audio signal into a pulse-width modulated signal and power-amplifies this signal, and supplies the power-amplified audio signal to a positive side of the first audio output terminal; a first inverting unit which inverts a polarity of the inputted first audio signal; a second class-D amplifying unit which converts the first audio signal inverted in the first inverting unit into a pulse-width modulated signal and power-amplifies this signal, and supplies the power-amplified audio signal to a negative side of the first audio output terminal; a third class-D amplifying unit which converts an inputted second audio signal into a pulse-width modulated signal and power-amplifies this signal, and supplies the power-amplified audio signal to a positive side of the second audio output terminal; a second inverting unit which inverts a polarity of the inputted second audio signal; a fourth class-D amplifying unit which converts the second audio signal inverted in the second inverting unit into a pulse-width modulated signal and power-amplifies this signal, and supplies the power-amplified audio signal to a negative side of the second audio output terminal; a first mode control unit which activates all the first to fourth class-D amplifying units when the first mode is specified, and performs protection so that outputs of the respective class-D amplifying units each become equal to or less than a first current value; and a second mode control unit which activates the first class-D amplifying unit and the fourth class-D amplifying unit and inactivates the second class-D amplifying unit and the third class-D amplifying unit when the second mode is specified, grounds each of a negative side of the first audio output terminal and a positive side of the second audio output terminal, and performs protection so that outputs of the first class-D amplifying unit and the fourth class-D amplifying unit each become equal to or less than a second current value larger than the first current value.

In each of the above class-D power amplifiers, it is preferable that the first mode is a mode prepared for a case of connecting one set of constant voltage speaker system to each audio output terminal, and the first current value is a value suppressing a maximum output of the class-D power amplifier to be equal to or less than a value corresponding to a predetermined power supply capacity when the constant voltage speaker system is connected.

Further, it is preferable that the second mode is a mode prepared for a case of connecting one low-impedance speaker to each audio output terminal, and the second current value is a value suppressing a maximum output of the class-D power amplifier to be equal to or less than a value corresponding to a predetermined power supply capacity when the low-impedance speaker is connected.

Advantageous Effects of Invention

The class-D power amplifier of this invention as above enables to produce at low cost a class-D power amplifier which is capable of efficiently driving both a speaker of low impedance and a speaker of constant voltage system while utilizing a common audio output terminal to connect with the both speakers.

BRIEF DESCRIPTION OF DRAWINGS

FIG. 2 is a diagram illustrating an example of a constant voltage speaker system.

FIG. 3 is a diagram illustrating operating modes prepared in power amplifying units illustrated in FIG. 1 and control of respective units performed in the respective modes.

FIG. 4 is a diagram illustrating an example of a conventional class-D amplifier of half-bridge connection.

DESCRIPTION OF EMBODIMENTS

Hereinafter, modes for carrying out the invention will be described specifically based on drawings.

Figure 1:
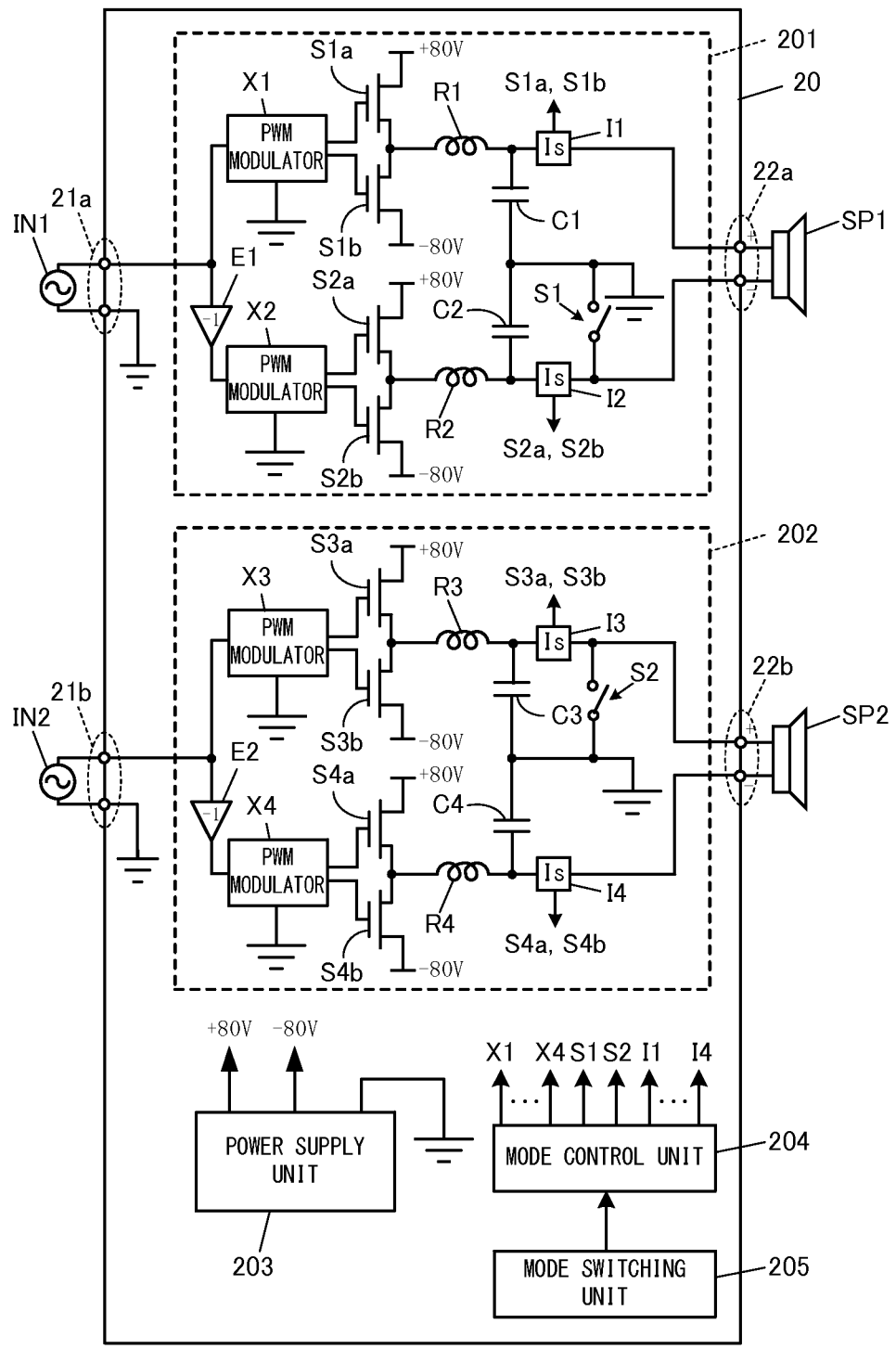
FIG. 1 is a diagram illustrating a structure of an amplifier which is an embodiment of a class-D power amplifier of the invention.
Figure 5:
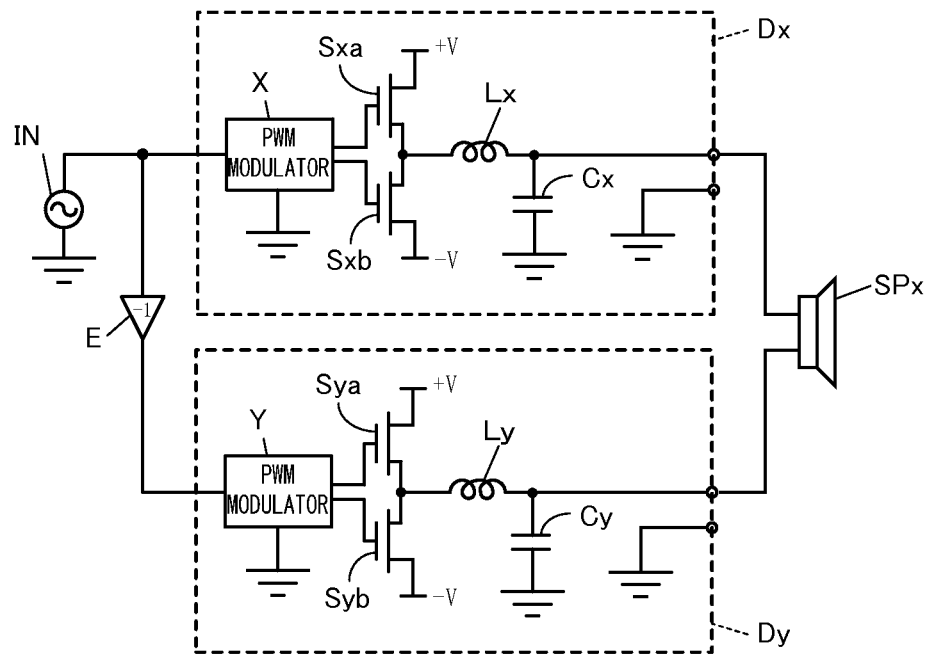
FIG. 5 is a diagram illustrating an example of a conventional class-D amplifier of full-bridge connection.

FIG. 1 illustrates a structure of an amplifier which is an embodiment of a class-D power amplifier of the invention.

An amplifier 20 illustrated in FIG. 1 includes a first amplifying unit 201 and a second amplifying unit 202, and has a function to amplify power of analog audio signals of respective one channels inputted via audio input terminals 21*a*, 21*b*, and output them via corresponding audio output terminals 22*a*, 22*b*.

Note that to the audio input terminals 21*a*, 21*b*, an audio device outputting an audio signal, such as an electronic musical instrument, a musical sound reproducing device, a microphone, a digital mixer, or the like can be connected arbitrarily as a signal source (in the range conforming to standards of the amplifier 20).

Further, a speaker to be connected to the audio output terminals 22*a*, 22*b* may be either a general single speaker whose impedance is 4Ω or 8Ω, or may be a constant voltage speaker system as illustrated in FIG. 2, but it is necessary to be set to an appropriate mode (which will be described later in detail) according to a connected speaker or speaker system.

This constant voltage speaker system is such that plural speakers are connected in parallel by the above-described constant voltage system. Then, to a main cable CB of high impedance, plural speakers SPa to SPd are connected via step-down transformers Ta to Td, respectively. Then, on the main cable CB, an analog audio signal is transmitted with high voltage (here, 100 V) conforming to the standards, such as 25 V, 70 V, 70.7 V, 100 V, and is supplied to the speakers SPa to SPd after it is lowered to appropriate voltage for driving the speakers SPa to SPd by the step-down transformers Ta to Td. The input impedance of the speakers SPa to SPd may be different in every speaker, and also the step-down ratio in each transformer may also be different in every speaker.

A characteristic point of this amplifier 20 is its operating control corresponding to the structure and operating mode of the first and second amplifying units 201, 202, and thus the amplifier 20 will be described more specifically below by mainly focusing on this point.

As illustrated in FIG. 1, the amplifier 20 includes a power supply unit 203, a mode control unit 204, and a mode switching unit 205, in addition to the first amplifying unit 201 and the second amplifying unit 202.

Among them, the power supply unit 203 is a power supply means providing a positive side power supply of +80 V and a negative side power supply of −80 V to each of four class-D amplifying units in total included in the first amplifying unit 201 and the second amplifying unit 202.

The mode control unit 204 has a function to control operation (active)/stop (inactive) of PWM modulators X1 to X4 and on/off of switches S1, S2 included in the first amplifying unit 201 and the second amplifying unit 202 according to a mode specified by the mode switching unit 205, and set electric current upper limits to current limiting circuits I1 to I4, thereby allowing the first amplifying unit 201 and the second amplifying unit 202 to perform operation corresponding to the mode.

Note that the mode switching unit 205 has a function to specify one of first to third modes according to an operation by the user, and can simply be structured by using a three-state switch (on/off of two passages) and a selector having three options (selectively connecting one of three terminals). A similar function may be performed by a microcomputer having a CPU.

Further, the first amplifying unit 201 and the second amplifying unit 202 respectively have two class-D amplifying units, and have a function to amplify power of an analog audio signal of respective one channels supplied from signal sources IN1, IN2 and inputted via the audio input terminals 21*a*, 21*b* (these signals will be referred to as input signals IN1, IN2, respectively) and output them through corresponding audio output terminals 22*a*, 22*b*.

Among them, the first amplifying unit 201 has a first class-D amplifying unit having a PWM modulator X1, switching elements S1*a*, S1*b*, a coil L1, and a capacitor C1, and a second class-D amplifying unit having a PWM modulator X2, switching elements S2a, S2b, a coil L2, and a capacitor C2.

The first class-D amplifying unit is active regardless of mode (constantly operating), but the second class-D amplifying unit can be active (operating) and inactive (stopped operating) depending on the mode. The second class-D amplifying unit which stopped operating hardly consumes power. To the first class-D amplifying unit, an analog audio signal (input signal IN1) inputted via the first input terminal 21a of the amplifier 20 is supplied, and to the second class-D amplifying unit, an input signal IN1inv inverted between positive and negative (polarity of voltage) by an inverter E1 is supplied.

In the first class-D amplifying unit, the PWM modulator X1 PWM-modulates the voltage of the input signal IN1 and outputs a PWM signal. Each of the switching elements S1a, S1b on the positive side and the negative side is a power MOSFET. A drain of the element S1a on the positive side is connected to the positive side power supply (+80 V), a source thereof is connected to a source of the element S1b on the negative side and an input end of the coil L1, and a drain of the element S1b on the negative side is connected to the negative side power supply (−80 V).

The switching elements S1a, S1b connect (switch) the input end of the coil L1 to either of the positive side power supply and the negative side power supply according to the PWM signal supplied to respective gates from the PWM modulator X1. Thus, a power-amplified PWM signal is supplied to the input end of the coil L1. Then, a higher range of the power-amplified PWM signal is cut by a low-pass filter formed by the coil L1 and the capacitor C1, and an analog audio signal which is the power-amplified input signal IN1 is demodulated at an output end of the coil L1 and is supplied to the positive side of the audio output terminal 22a.

Similarly, in the second D-class amplifying unit in an active state, the inverted input signal IN1inv is PWM-modulated by the PWM modulator X2, and is power-amplified by the switching elements S2a, S2b. Then, a higher range of the power-amplified PWM signal is cut by a low-pass filter formed by the coil L2 and the capacitor C2, and an analog audio signal which is the power-amplified inverted input signal IN1inv is demodulated at the output end of the coil L2, and is supplied to the negative side of the audio output terminal 22a.

Further, in the first amplifying unit 201, the current limiting circuits I1, I2 are provided respectively on the signal output paths from the first class-D amplifying unit and the second class-D amplifying unit to the audio output terminal 22. These current limiting circuits I1, I2 have a function to forcibly turn off the corresponding switching elements by connecting the gate to the ground or the like, to thereby stop output of signals, when current value of a signal outputted from the corresponding class-D amplifying unit exceeds a predetermined value controlled by the mode control unit 204. The current limiting circuit I1 turns off the switching elements S1a, S1b, and the current limiting circuit I2 turns off the switching elements S2a, S2b.

However, when the current limiting circuits I1, I2 turn off the switching elements, the electric current no longer flows to the current limiting circuits, and thus the detected current value quickly becomes equal to or less than the current upper limit value. Then, after a predetermined time has passed from the forcible turning off, the current limiting circuits I1, I2 cancel the forcible off of the switching elements. Then, in response to that, output of the audio signal after amplification by the class-D amplifying unit is performed as before.

Therefore, the current limiting circuits I1, I2 operate to protect the power supply, elements of an output unit, and the connected speaker of the first amplifying unit 201 from exceeding each assumed power at a time of design of the amplifier 20 and breaking.

For example, when the assumed maximum output of the amplifier 20 to each speaker when two speakers of 4Ω are connected (second operating mode) is 250 Wmax, the above-described predetermined value just needs to be a value satisfying 4×I×I=250, and I≈7.9 A (effective value)≈11.2 A (peak value).

Further, when the assumed maximum output of the amplifier 20 when one speaker of 8Ω is connected (third operating mode) is 500 Wmax, the above-described predetermined value just needs to be a value satisfying 8>I×I=500, and thus I≈7.9 A (effective value)≈11.2 A (peak value).

Further, when the assumed maximum output of the amplifier 20 to each system when two sets of constant voltage speaker systems are connected (first operating mode) is 250 Wmax, since the maximum output voltage (effective value) of a 100 V system is 100 V, the current upper limit value I can be obtained as I=250/100=2.5 A (effective value)≈3.5 A (peak value). In this case, each constant voltage speaker system needs to be structured to have its entire input impedance to be 100/2.5=40Ω or more. When the number of speakers constituting one set of 100 V system is increased, resulting in the input impedance of smaller than 40Ω, the amplifier 20 becomes unable to output up to the assumed maximum output.

As described above, the maximum output assumed as to the entire amplifier 20 is all the same (500 Wmax) regardless of which of two sets of 100 V systems, two 4Ω speakers, and one 8Ω speaker the connected speakers are. This is for making maximum use of the capacity of the employed power supply.

Further, in the first amplifying unit 201, the switch S1 is provided for switching to ground or not to ground the negative side of the audio output terminal 22a.

When the second class-D amplifying unit is inactivated, the switch S1 is turned on simultaneously to ground the negative side of the audio output terminal 22a. Thus, the first amplifying unit 201 functions as a class-D amplifier of a structure of the half-bridge connection of only the first class-D amplifying unit. Here, inactivation of the second class-D amplifying unit is performed by, specifically, stopping the PWM modulator X2 and fixing the switching elements S2a, S2b to off. In this case, electric current hardly flows from the power supply unit 203 to the second class-D amplifying unit, and the power consumption is reduced by this amount.

On the other hand, when the second class-D amplifying unit is activated, the switch S1 is turned off simultaneously. Thus, in the first amplifying unit 201, the signal outputted by the first class-D amplifying unit is supplied to the positive side of the audio output terminal 22a and the signal outputted by the second class-D amplifying unit is supplied to the negative side of the audio output terminal 22a, and the speaker SP1 is driven by the signal of a difference thereof. Therefore, the first amplifying unit 201 functions as a class-D amplifier in which the first class-D amplifying unit and the second class-D amplifying unit are full-bridge connected.

Further, the second amplifying unit 202 has a third class-D amplifying unit having a PWM modulator X3, switching elements S3a, S3b, a coil L3, and a capacitor C3, and a fourth class-D amplifying unit having a PWM modulator X4, switching elements S4a, S4b, a coil L4, and a capacitor C4. The fourth and third class-D amplifying units can each be activated (operating) and inactivated (stopped operating) depending on the mode. The class-D amplifying unit which stopped operating hardly consumes power. To the third class-D amplifying unit, an analog audio signal (input signal IN2) inputted via the second input terminal 21b of the amplifier 20 is supplied, and to the fourth class-D amplifying unit, an input signal IN2inv inverted between positive and negative (polarity of voltage) by an inverter E2 is supplied.

Then, the third class-D amplifying unit in an active state power-amplifies the input signal IN2 and supplies it to the positive side of the audio output terminal 22b, and the fourth class-D amplifying unit in an active state power-amplifies the inverted input signal IN2inv and supplies it to the negative side of the audio output terminal 22b. The functions of the respective class-D amplifying units and the current limiting circuits I3, I4 are the same as in the case of the first amplifying unit 201, and thus detailed descriptions are omitted.

Moreover, in the second amplifying unit 202, the switch S2 is provided for switching to ground or not to ground the positive side of the audio output terminal 22b.

When the third class-D amplifying unit is inactivated, the switch S2 is turned on simultaneously to ground the positive side of the audio output terminal 22b. Thus, the second amplifying unit 202 functions as a class-D amplifier of a structure of the half-bridge connection of only the fourth class-D amplifying unit. Here, inactivation of the third class-D amplifying unit is performed by, specifically, stopping the PWM modulator X3 and fixing the switching elements S3a, S3b to off. In this case, electric current hardly flows from the power supply unit 203 to the third class-D amplifying unit, and the power consumption is reduced by this amount.

On the other hand, when the third class-D amplifying unit is activated, the switch S2 is turned off simultaneously. Thus, in the second amplifying unit 202, the signal outputted by the third class-D amplifying unit is supplied to the positive side of the audio output terminal 22b, and the signal outputted by the fourth class-D amplifying unit is supplied to the negative side of the audio output terminal 22b, and the speaker SP2 is driven by the signal of a difference thereof. Therefore, the second amplifying unit 202 functions as a class-D amplifier in which the third class-D amplifying unit and the fourth class-D amplifying unit are full-bridge connected.

Next, operating modes of the amplifier 20 will be described.

FIG. 3 is a diagram illustrating operating modes prepared in the amplifier 20 and control of respective units performed in each mode. An operating mode is, as described above, set by the user to the mode switching unit 205, and according to the set mode, the mode control unit 204 outputs a control signal to the respective units illustrated in FIG. 1 for performing the operation illustrated in FIG. 3.

First, the first operating mode is an operating mode set by the user when a constant voltage speaker system is connected to the audio output terminals 22a, 22b.

In this case, the first to fourth class-D amplifying units (PWM modulators X1 to X4) are all operated (activated). Further, the switches S1 and S2 are turned off. Then, the current upper limit value of the current limiting circuits I1 to I4 are switched to a first value (effective value 2.5 A or peak value 3.5 A) for protection so that the output of the amplifier 20 does not exceed the assumed maximum output (250 W) when the 100 V system is connected.

In this first operating mode, the first amplifying unit 201 and the second amplifying unit 202 each function as a class-D amplifier of full-bridge connection. Therefore, the amplifier 20 can oscillate voltage of the analog audio signal supplied to the audio output terminals 22a, 22b in a range of voltage ($-160+\alpha$ V to $+160-\alpha$ V) slightly narrower than double of each voltage ($\pm 80$ V) supplied by the power supply unit 203, and can drive the 100 V constant voltage speaker system with a maximum amplitude of assumed effective 100 V or more. Therefore, even when a voltage variation is anticipated, as the switching elements S1a to S4b, elements with relatively low withstand voltage of about 200 V can be used. As such switching elements, inexpensive and reliable ones can be obtained, and thus an inexpensive and reliable one can be produced as the entire system.

Further, the second operating mode is an operating mode set by the user when a speaker of low impedance (4Ω for example) is connected to the audio output terminals 22a and 22b.

In this case, the first and fourth class-D amplifying units (PWM modulators X1, X4) are operated, and the second and third class-D amplifying units (PWM modulators X2, X3) are stopped (inactivated). Further, the switches S1 and S2 are turned on. Then, the current upper limit values of the current limiting circuits I1 and I4 are switched to a second value (effective value 7.9 A or peak value 11.2 A) for protection so that the output of the amplifier 20 does not exceed the assumed maximum output (250 W) when the speaker of low impedance of 4Ω is connected.

The impedance of the speaker in this case is low compared to the constant voltage speaker system, and thus the second value determined based on the same maximum output becomes a value larger than the above-described first value. Note that regarding the current limiting circuits I2 and I3, any current upper limit value is acceptable because the switching elements S2a, S2b, S3a, S3b are turned off and flowing of large current is unthinkable.

In this second operating mode, the first amplifying unit 201 and the second amplifying unit 202 each function as a class-D amplifier of half-bridge connection. Therefore, the amplifier 20 can oscillate the voltage of the analog audio signal supplied to the audio output terminals 22a, 22b in the range of voltage ($-80+\beta$ V to $+80-\beta$ V) slightly narrower than the voltage ($\pm 80$ V) supplied by the power supply unit 203. The amplitude at the assumed maximum output (250 W) is $4 \times 7.9 = 31.6$ V (effective value)≈44.7 V (peak value), and thus in this case, only about ±23 V out of the power supply voltage ±80 V is used effectively in driving by full-bridge connection. However, in this embodiment, since it is driven by half-bridge connection, about 45 V out of ±80 V is used effectively.

Figure 6:
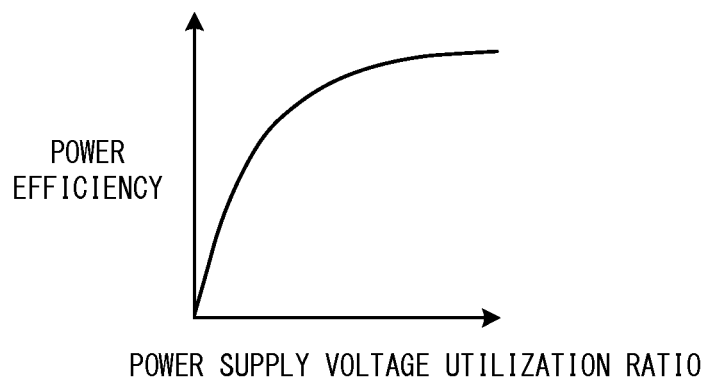
FIG. 6 is a diagram illustrating a relation between a power supply voltage utilization ratio and power efficiency in a class-D amplifier.

Here, by switching to the half-bridge connection, the voltage use efficiency has improved. As illustrated in FIG. 6, by the amount that the power supply voltage utilization ratio can be increased, high power efficiency can be obtained. Further, since the second and third class-D amplifying units are stopped, the power consumption can be reduced also by this amount.

Note that in the class-D power amplifier, it is known that a phenomenon called pumping occurs in the case of half bridge. This phenomenon is such that, describing regarding the first amplifying unit 201, since the coil L1 as an inductive load is provided on the signal output line, the electric current flows in a reverse direction to the voltage from the power supply at a moment that conduction and non-conduction of the switching elements S1*a* and S1*b* is switched, and due to this, the capacitor of the power supply unit is charged equal to or more than the power supply voltage, varying the voltage of the power supply. Then, when the pumping phenomenon occurs, the power supply voltage on the positive side and the power supply voltage on the negative side become imbalanced, resulting in noise in output or application of voltage larger than assumed value to the switching elements of the output stage.

In the case of full bridge, the pumping phenomenon appears in reverse direction from each other in the power supplies of positive side and negative side due to the electric current from the two class-D power amplifying units, and thus imbalance of power supply voltage does not occur.

In the case of the second operating mode, since it is basically the half-bridge connection, there is a possibility of this pumping phenomenon to occur. However, since the non-inverted input signal IN1 is power-amplified in the first amplifying unit 201 and the inverted input signal IN2inv is power-amplified in the second amplifying unit, when two relatively similar signals are inputted such as an L channel signal and an R channel signal of stereo as the input signals IN1 and IN2, similarly to the case of the full-bridge connection, regenerative power from the first amplifying unit 201 to the power supply and regenerative power from the second amplifying unit 202 to the power supply cancel each other, and the pumping phenomenon no longer occurs. That is, it is recommended to input two signals having high similarity as the input signals IN1, IN2 in the second operating mode.

Further, the third operating mode is an operating mode set by the user when a speaker of low impedance (for example, 8Ω) is connected only to the audio output terminal 22*a* and it is desired to obtain a large output even at the expense of the number of channels.

In this mode, the first and second class-D amplifying units (PWM modulators X1, X2) are operated, and meanwhile the third and fourth class-D amplifying units (PWM modulators X3, X4) are stopped (inactivated). Further, the switch S1 is turned off. The second amplifying unit 202 is substantially not operated, and thus the switch S2 may be either on or off.

Then, the current upper limit values of the current limiting circuits I1, I2 are switched to a third value (effective value 7.9 A or peak value 11.2 A) for protection so that the output of the amplifier 20 does not exceed the assumed maximum value (500 W) when the low-impedance speaker of 8Ω is connected. Regarding the current limiting circuits I3 and I4, any current upper limit value is acceptable because the switching elements S3*a*, S3*b*, S4*a*, S4*b* are turned off and flowing of large current is unthinkable. Focusing attention only on the first amplifying unit 201, a speaker of double impedance (8Ω) is driven in the third operating mode with voltage of double that of the second operating mode, so as to obtain a double maximum output (500 W). In this case, the electric current at a time of maximum output becomes the same value between the second operating mode and the third operating mode, and thus the second value and the third value of the current limiting circuits I1, I2 can be mutually the same values.

In this third operating mode, the first amplifying unit 201 functions as a class-D amplifier of full-bridge connection, and the second amplifying unit 202 stops functioning Therefore, by the amount of the maximum output power secured for the second amplifying unit 202, the maximum output power of the first amplifying unit 201 can be increased, and a signal of large output can be outputted. In this case, the amplifier 20 can oscillate the voltage of the analog audio signal supplied to the audio output terminals 22*a*, 22*b* in the range of voltage ($-160+\alpha$ V to $+160-\alpha$ V) slightly narrower than double of each voltage ($\pm 80$ V) supplied by the power supply unit 203. The amplitude at the assumed maximum output (500 W) is 8×7.9=63.2 V (effective value)≈89.4 V (peak value), and in this case, about 45 V out of the power supply voltage ±80 V is used effectively. Further, since it is the full-bridge connection, it is tolerant to the pumping phenomenon. Moreover, since the third and fourth class-D amplifying units are stopped, the power consumption can be reduced also by this amount.

The description of the embodiments has thus finished. However, it is needless to say that the structures of devices and the structures of circuits, the settings of modes, and specific numeric values are not limited to those described in the above-described embodiments.

For example, in the above-described embodiments, the amplifier having four class-D amplifying units is described, but the power amplifier may be one having a plurality of such units of four. In this case, considering the influence of the pumping phenomenon in the second operating mode, preferably, one power supply unit 203 is provided for class-D amplifying units of a positive integral multiple of four.

Further, only one of the first amplifying unit 201 and the second amplifying unit 202 may be provided in the power amplifier. That is, regarding the two class-D amplifying units, it is conceivable that a predetermined one is inactivated and the other is activated in the second mode and ground the side corresponding to the inactivated class-D amplifying unit out of the positive side and negative side of the audio output terminals. In this case, the influence of the pumping phenomenon in the second operating mode needs to be considered separately, but improvement of voltage use efficiency and effect of cost down owing to separate use of the half-bridge connection and the full-bridge connection can be obtained similarly to the cases of the above-described embodiments.

Further, in the above-described embodiments, examples in which the operating mode is specified manually by the user are described. However, it is also conceivable to provide the power amplifier with means for detecting impedance of a load such as speakers connected to the audio output terminal, to identify the type (4Ω, 8Ω, 100 V constant voltage, 70 V constant voltage, or the like) of the speakers connected to the audio output terminals 22*a*, 22*b* according to the detected impedance, so as to automatically set the operating mode suitable for the identified type.

For example, when the detected impedance is about 25Ω to 1 kilo Ω, it is identified that a constant voltage speaker system is connected, and the first operating mode is set. When the detected impedance is about 8Ω to 20Ω regarding the audio output terminal 22*a* and is non-connected (several kilo Ω or more) regarding the audio output terminal 22*b*, it is identified that one speaker of 8Ω is connected and the third mode may be set, or otherwise (at least one is smaller than 8Ω or the both are smaller than 20Ω it is identified that a speaker of 4Ω is connected or two low-impedance speakers are connected and the second mode may be set. In this manner, the situation that an assumed maximum output cannot be obtained due to a setting error of the user can be prevented.

Further, although the class-D power amplifier of the above-described embodiments employed the power supply of about ±80 V corresponding to the connected 100 V constant voltage system, it is not necessary to be set strictly to ±80 V, and may be voltage that is different by about a few volts to several tens of volts. Further, if a different constant voltage system is connected, it is necessary to employ a power supply of different voltage corresponding to the system. For example, a power supply of about ±20 V may be employed if a 25 V constant voltage system is connected, and a power supply of about ±55 V may be employed if a 70 V constant voltage system is connected. Further, in these cases, the first current value and the second current value has to be determined appropriately according to the speaker or system to be driven and the maximum output power of the power amplifier.

Further, of course this invention is applicable not only to a stand-alone amplifier but also to a power amplifier constituted integrally with an arbitrary audio signal processing device, such as an electronic musical instrument, a digital mixer, an effector, a tone generating device, or an audio input/output device.

Further, it is also possible to apply the structure and modification example as has been described above in an appropriate combination within a consistent range.

INDUSTRIAL APPLICABILITY

As is clear from the above description, the class-D power amplifier of this invention enables to produce at low cost a class-D power amplifier which is capable of efficiently driving even a speaker of constant voltage system while utilizing a common audio output terminal to connect with the speakers.

Therefore, by applying this invention, quality of the class-D power amplifier can be improved.

REFERENCE SIGNS LIST

20 . . . amplifier, 21a, 21b . . . audio input terminal, 22a, 22b . . . audio output terminal, 201 . . . first amplifying unit, 202 . . . second amplifying unit, 203 . . . power supply unit, 204 . . . mode control unit, 205 . . . mode switching unit, C1 to C4 . . . capacitor, CB . . . main cable, D12, D34 . . . class-D power amplifying unit, E1, E2 . . . inverter, I1 to I4 . . . current limiting circuit, IN1, IN2 . . . input signal, L1 to L4 . . . coil, S1, S2 . . . switch, S1a to S4a, S1b to S4b . . . switching element, SP1, SP2, Spa to SPd . . . speaker, Ta to Td . . . step-down transformer, X1 to X4 . . . PWM modulator

The invention claimed is:
1. A class-D power amplifier, comprising:
a first audio output terminal;
a mode specifying unit which specifies one of a first mode and a second mode;
a first class-D amplifying unit which converts an inputted first audio signal into a first pulse-width modulated signal and power-amplifies this first pulse-width modulated signal into a first power-amplified audio signal, and supplies the first power-amplified audio signal to a positive side of the first audio output terminal;
a first inverting unit which inverts a polarity of the inputted first audio signal into a first inverted audio signal;
a second class-D amplifying unit which converts the first inverted audio signal into a second pulse-width modulated signal and power-amplifies this second pulse-width modulated signal into a second power-amplified audio signal, and supplies the second power-amplified audio signal to a negative side of the first audio output terminal;
mode control circuitry which:
when the first mode is specified, activates the first and second class-D amplifying units, and performs protection so that outputs of the first and second class-D amplifying units each become equal to or less than a first current upper limit value, wherein the protection based on the first current upper limit value suppresses a maximum output of the class-D power amplifier to be equal to or less than a value corresponding to a predetermined power supply capacity when a constant voltage speaker system is connected to the first audio output terminal; and
when the second mode is specified, inactivates one of the first class-D amplifying unit and the second class-D amplifying unit and activates the other, grounds one side corresponding to the inactivated class-D amplifying unit out of the positive side and the negative side of the first audio output terminal, and performs protection so that an output of the activated class-D amplifying unit becomes equal to or less than a second current upper limit value larger than the first current upper limit value, wherein the protection based on the second current upper limit value suppresses a maximum output of the class-D power amplifier to be equal to or less than a value corresponding to a predetermined power supply capacity when a low-impedance speaker is connected to the first audio input terminal.

2. The class-D power amplifier according to claim 1, comprising:
a second audio output terminal;
a third class-D amplifying unit which converts an inputted second audio signal into a third pulse-width modulated signal and power-amplifies this third pulse-width modulated signal into a third power-amplified audio signal, and supplies the third power-amplified audio signal to a positive side of the second audio output terminal;
a second inverting unit which inverts a polarity of the inputted second audio signal into a second inverted audio signal;
a fourth class-D amplifying unit which converts the second inverted audio signal into a fourth pulse-width modulated signal and power-amplifies this fourth pulse-width modulated signal into a fourth power-amplified audio signal, and supplies the fourth power-amplified audio signal to a negative side of the second audio output terminal, and
wherein the mode control circuitry:
when the first mode is specified, further activates the third and fourth class-D amplifying units, and further performs protection so that outputs of the third and fourth class-D amplifying units each become equal to or less than the first current upper limit value, and
when the second mode is specified, further activates one of the third and fourth class-D amplifying units corresponding to the same side as the one side and inactivates the other of the third and fourth class-D amplifying units, grounds a side corresponding to the inactivated other of the third and fourth class-D amplifying units out of the positive side and the negative side of the second audio output terminal, and performs protection so that output of the activated one of the third and fourth class-D amplifying units becomes equal to or less than the second current upper limit value.

3. A class-D power amplifier, comprising:
a first audio output terminal;
mode specifying circuitry configured to specify one of a first mode and a second mode;
first class-D amplifying circuitry configured to convert an inputted first audio signal into a first pulse-width modulated signal and power-amplify this first pulse-width modulated signal into a first power-amplified audio signal, and supply the first power-amplified audio signal to a positive side of the first audio output terminal;
first inverting circuitry configured to invert a polarity of the inputted first audio signal into a first inverted audio signal;
second class-D amplifying circuitry configured to convert the first inverted audio signal into a second pulse-width modulated signal and power-amplify this second pulse-width modulated signal into a second power-amplified audio signal, and supply the second power-amplified audio signal to a negative side of the first audio output terminal;
mode control circuitry configured to:
when the first mode is specified, activate the first and second class-D amplifying circuitry, and perform protection so that outputs of the first and second class-D amplifying circuitry each become equal to or less than a first current upper limit value, wherein the protection based on the first current upper limit value suppresses a maximum output of the class-D power amplifier to be equal to or less than a value corresponding to a predetermined power supply capacity when a constant voltage speaker system is connected to the first audio output terminal; and
when the second mode is specified, inactivate one of the first class-D amplifying circuitry and the second class-D amplifying circuitry and activate the other, ground one side corresponding to the inactivated class-D amplifying circuitry out of the positive side and the negative side of the first audio output terminal, and perform protection so that an output of the activated class-D amplifying circuitry becomes equal to or less than a second current upper limit value larger than the first current upper limit value, wherein the protection based on the second current upper limit value suppresses a maximum output of the class-D power amplifier to be equal to or less than a value corresponding to a predetermined power supply capacity when a low-impedance speaker is connected to the first audio input terminal.

4. The class-D power amplifier according to claim 3, comprising:
a second audio output terminal;
third class-D amplifying circuitry configured to convert an inputted second audio signal into a third pulse-width modulated signal and power-amplify this third pulse-width modulated signal into a third power-amplified audio signal, and supply the third power-amplified audio signal to a positive side of the second audio output terminal;
second inverting circuitry configured to invert a polarity of the inputted second audio signal into a second inverted audio signal;
fourth class-D amplifying circuitry configured to convert the second inverted audio signal into a fourth pulse-width modulated signal and power-amplify this fourth pulse-width modulated signal into a fourth power-amplified audio signal, and supply the fourth power-amplified audio signal to a negative side of the second audio output terminal, and
wherein the mode control circuitry is configured to:
when the first mode is specified, further activate the third and fourth class-D amplifying circuitry, and further perform protection so that outputs of the third and fourth class-D amplifying circuitry each become equal to or less than the first upper limit current value, and
when the second mode is specified, further activate one of the third and fourth class-D amplifying circuitry corresponding to the same side as the one side and inactivate the other of the third and fourth class-D amplifying circuitry, ground a side corresponding to the inactivated other of the third and fourth class-D amplifying circuitry out of the positive side and the negative side of the second audio output terminal, and perform protection so that output of the activated one of the third and fourth class-D amplifying circuitry becomes equal to or less than the second current upper limit value.

* * * * *